(12) United States Patent
Quach et al.

(10) Patent No.: US 6,772,383 B1
(45) Date of Patent: Aug. 3, 2004

(54) COMBINED TAG AND DATA ECC FOR ENHANCED SOFT ERROR RECOVERY FROM CACHE TAG ERRORS

(75) Inventors: Nhon Toai Quach, San Jose, CA (US); John Fu, Saratoga, CA (US); Sunny Huang, Saratoga, CA (US); Jeen Miin, Fremont, CA (US); Dean Mulla, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/321,060

(22) Filed: May 27, 1999

(51) Int. Cl.$^7$ .......................... G06F 11/00; G06F 11/30; G08C 25/00; H03M 13/00; H04L 1/00

(52) U.S. Cl. .......................... 714/746; 365/49; 711/108; 711/111

(58) Field of Search .......................... 714/6, 764, 773, 714/803, 816, 755, 758, 746, 766, 710, 768, 54, 800–802, 57, 723, 48, 748, 751, 750, 759; 710/39–40; 711/108, 146, 113; 708/531; 359/1; 369/44, 32; 386/50; 365/49, 189.01, 230.03; 375/135–136, 141, 147, 146; 340/7.44; 341/56

(56) References Cited

U.S. PATENT DOCUMENTS

| | | | | |
|---|---|---|---|---|
| 4,241,446 A | * | 12/1980 | Trubisky | 714/777 |
| 4,604,750 A | * | 8/1986 | Manton et al. | 714/764 |
| 4,649,542 A | * | 3/1987 | Nishimura et al. | 714/755 |
| 4,651,321 A | * | 3/1987 | Woffinden et al. | 714/763 |
| 4,742,517 A | * | 5/1988 | Takagi et al. | 341/59 |
| 4,945,512 A | * | 7/1990 | DeKarske et al. | 365/189.01 |
| 5,226,150 A | * | 7/1993 | Callander et al. | 714/57 |
| 5,345,582 A | * | 9/1994 | Tsuchiya | 714/53 |
| 5,357,527 A | * | 10/1994 | Coates et al. | 714/755 |
| 5,450,340 A | * | 9/1995 | Nicolaidis | 708/531 |
| 5,459,850 A | * | 10/1995 | Clay et al. | 11/115 |
| 5,557,622 A | * | 9/1996 | Hassoun et al. | 714/800 |
| 5,642,494 A | * | 6/1997 | Wang et al. | 711/140 |
| 5,809,524 A | * | 9/1998 | Singh et al. | 711/118 |
| 5,841,961 A | * | 11/1998 | Kozaru et al. | 714/5 |
| 5,916,314 A | * | 6/1999 | Berg et al. | 714/6 |
| 6,038,693 A | * | 3/2000 | Zhang | 714/768 |
| 6,101,614 A | * | 8/2000 | Gonzales et al. | 714/6 |
| 6,430,723 B2 | * | 8/2002 | Kodama et al. | 714/763 |

OTHER PUBLICATIONS (Adaptive source rate control for real–time wireless video transmission; Mobile Networks and Applications, pp 49–60, 1998).*

Ritthongpitak et al.(Optimal Two–Level Unequal Error control Codes for Computer Systems; IEEE, 1996).*

* cited by examiner

*Primary Examiner*—Christine T. Tu
*Assistant Examiner*—Guy Lamarre
(74) *Attorney, Agent, or Firm*—Blakely, Sokoloff, Taylor & Zafman LLP

(57) ABSTRACT

A computer data signal comprises a first code group and a second code group. The first code group has a first symbol and an error detection code for the first symbol. The second code group has a second symbol and an error correction code. The error correction code provides error correction for a third symbol that includes the first symbol and the second symbol.

27 Claims, 7 Drawing Sheets

COMBINED TAG AND DATA ECC FOR ENHANCED SOFT ERROR RECOVERY FROM CACHE TAG ERRORS

BACKGROUND OF THE INVENTION

1. Field of the Invention

This invention relates to error detecting and correcting codes and, more particularly, to error detecting and correcting codes applicable to cache memories.

2. Background Information

It is axiomatic that data entering a data processor, whether it originates in a local memory, or is received from a remote source via a communication link, must be correct. For this reason many error detecting codes (EDC) and error correcting codes (ECC) have been developed to insure the integrity of the information to be processed. Common to all of these codes is redundancy, wherein additional bits are added to the information bits, as a function thereof, to permit the algorithm controlling the check bits to be recomputed at the destination for error detection and possible correction, if the code is sufficiently redundant. Computer memories are an example of a source of data entering a data processor where it is advantageous to use error detecting and error correcting codes. The most likely source of errors in computer memories is corruption of the data during the time the data is held in the memory. Such soft (intermittent) errors may be induced by background cosmic radiation and alpha particle bombardment.

It is well known in the prior art to add a parity bit to units of data being stored in computer memories to detect a single bit error in the data unit when the unit is read. Typically, a parity bit is added for each 8 bit byte of data in the memory. Thus, 9 bits of storage are used for each 8 bit byte of data storage provided. Parity protected memories are limited in that the process requesting faulty data only knows that the data is faulty. There is no general mechanism to allow the process to recover from the error. Most often, a memory fault requires that the process be terminated. It is also well known in the prior art to add error correction codes to units of data being stored to detect and correct errors. This provides a system that can recover from detected errors. For example, a 32 bit computer word can be protected by adding a 6 bit ECC. The ECC allows all single bit errors to be detected and corrected. A 7 bit ECC detects and corrects single bit errors and also detects double bit errors.

To speed memory access, computers often use cache memory, which is a small high speed memory that provides fast access to a copy of the data in current use. Various schemes for managing data transfers between the main memory and the cache memory are well known in the art. All cache memories must provide a means for finding data associated with an address in the larger main memory in the smaller cache memory. One commonly used technique for constructing a cache memory is the set associative cache.

A set associative cache memory contains a predetermined number of cache lines, each line containing a predetermined number of bytes. The low order address bits are used to locate a line and a byte in the cache memory corresponding to any data byte in the main memory. However, there are many bytes of data in the main memory that have the same low order address bits and which would be located in the same place in the cache memory. Therefore, the unused high order address bit, termed the tag bits, are stored in an associated tag memory. When cache memory is accessed, the tag bits stored on the line being accessed are compared to the high order incoming address bits to see if the cache memory contains the byte being accessed. If the tag bits are the same as the high order address bits then there is a cache hit, the cache contains a copy of the main memory address being accessed. Thus, a cache memory read involves first reading the tag memory to see if the cache line contain the desired data, and then reading the data from the data memory if there is a hit.

N-way set associative cache memories provide N locations, where N is 2 or more, that are accessed by the same low order address bits. This allows the number of conflicts for use of a storage location to be reduced because each main memory location can be located in 1 of N locations. When an N-way cache memory is accessed, N tags are retrieved and each tag is compared to the high order incoming address bits to see if any of the N ways of the cache memory contains the byte being accessed.

Cache memory, like all memory, is subject to data corruption. Error correction is especially desirable in cache memory because the majority of memory accesses are likely to involve the cache memory in a well-designed system. It is well known in the prior art to add ECC to the tag memory and to the data memory. However, the number of bits required by an ECC is geometrically related to the number of bits being protected. ECCs to protect short word lengths increase the amount of storage disproportionately. An exemplary computer architecture might use a physical memory address of 44 bits and employ a 512 kilobyte (kb) cache. The cache line might be 8 bytes (64 bits) long. The bottom 3 address bits select a byte within the cache line, the middle 16 bits are the address which selects a cache line and the remaining 25 upper bits are the tag. To provide single bit error correction, a 25 bit tag requires 5 ECC bits and a 64 bit (8 byte) cache line requires 7 ECC bits. Thus, for each cache line in this example, there will be a total of 89 data bits and 12 ECC bits. This represents about 13% additional storage for the ECC bits. However, about 41% of the redundancy is being used to protect the 25 tag bits which represent about 28% of the data.

Accordingly, there is a need for a method and apparatus that allows error correcting codes to be applied more efficiently to set associative cache memories and other applications that require protection of multiple units of related data.

SUMMARY OF THE INVENTION

A computer data signal comprises a first code group and a second code group. The first code group has a first symbol and an error detection code for the first symbol. The second code group has a second symbol and an error correction code. The error correction code provides error correction for a third symbol that includes the first symbol and the second symbol.

DETAILED DESCRIPTION OF THE INVENTION

Figure 1:
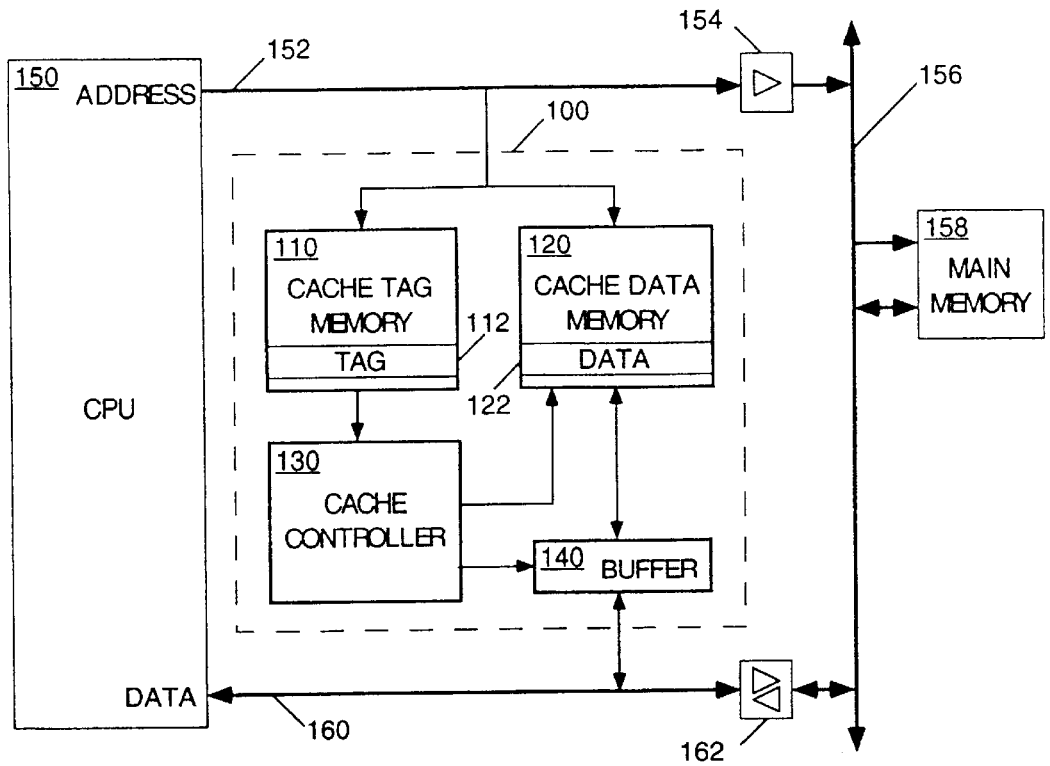
FIG. 1 is a block diagram of a computer system with a set associate cache.

One class of error correcting codes, now known as Hamming codes, is described by R. W. Hamming in "Error Detecting and Error Correcting Codes", Bell Systems Technical Journal, 29, 1950, pages 147–160. Hamming described several specific instances of Hamming codes. The specific codes described were single error detection codes (SED), single error correction codes (SEC), and single error correction, double error detection codes (SEC/DED). Error correcting code theory and applications are treated in the text "Error Control Coding, undamentals and Applications" by Lin et al., published by Prentice-Hall, 1982.

The correction capabilities of any code is dependent upon redundancy. In the simplest case of an SED, a single parity bit, the redundancy is very low and there are no correction possibilities. In fact, two compensating errors will not be detected, as the parity is unchanged. A Hamming SEC is more redundant, with the number of redundant ECC bits related to the number of information bits that are to be protected. Four ECC bits are required to provide SEC for up to eleven information bits. The number of ECC bits required is related to the number of information bits in a geometric fashion. Eight ECC bits can provide SEC for up to 247 information bits.

While it might seem that it would be advantageous to protect a very large number of information bits with a single set of ECC bits to reduce the redundancy, such an approach is limited because the probability of two errors in a code symbol, which is the combination of the information bits and the ECC bits, increases as the number of bits in the code symbol increases. Thus it is necessary to select a number of information bits to be protected by an error correcting code that balances the redundancy against the probability of an undetectable multi-bit error. When error correcting codes are used to protect a small number of information bits, the redundancy becomes very high.

In standard coding theory notation, k represents the number of data bits in a code word, r represents the number of check bits in the code word, and n represents the total number of bits in a code word (n=k+r). According to Hamming, a single error correcting (distance 3) code must satisfy the equation $2^r \geq k+r+1$; while a single error correcting with double error detection (distance 4) code must satisfy the equation $2^{r-1} \geq k+r$. Table 1 gives the minimum number of check bits for up to 1013 data bits for distance 3 (SEC) and distance 4 (SEC/DED) codes.

TABLE 1

| | r check bits | |
|---|---|---|
| k data bits | SEC | SEC/DED |
| 1 | 2 | 3 |
| 2–4 | 3 | 4 |
| 5–11 | 4 | 5 |
| 12–26 | 5 | 6 |
| 27–57 | 6 | 7 |
| 58–120 | 7 | 8 |
| 121–247 | 8 | 9 |
| 248–502 | 9 | 10 |
| 503–1013 | 10 | 11 |

It will be noted that the "overhead" of the Hamming code, the ratio of the number of check bits required to the number of data bits protected, is high when the number of data bits to be protected is small. For single error correction, twenty-five information bits require five check bits, while eighty-nine information bits only require seven check bits.

In certain applications, such as set associative cache memories, data is received in a segmented fashion. FIG. 1 illustrates an exemplary cache memory 100 in a computer system. The cache memory 100 is coupled to an address bus 152 from a CPU 150 and to a bi-directional data bus 160 connected to the CPU 150. A cache controller 130 controls the operation of the cache memory 100 and co-ordinates cache operations with CPU 150 memory accesses. Connections between the cache controller 130 and other elements that are not immediately relevant to the present invention have been omitted to avoid obscuring the disclosure of the invention. For example, the cache controller 130 will typically control an address bus driver 154 and a data bus driver 162 to couple the CPU 150 to a system bus 156 when access to the main memory 158 is required and to decouple the CPU busses 152, 160 when the cache memory 100 can handle the memory transaction.

Figure 2:
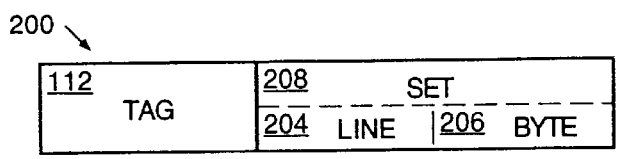
FIG. 2 is an illustration of the bit organization of a memory address as applied to a set associative cache.

Cache memory 100 is organized in "lines." In a typical associative cache, each line includes a data field 122 and a tag field 112. The cache memory 100 may include hundreds of cache lines, each line including a data portion 122 which may be many bytes in length. As may be seen in FIG. 2, each main memory address 200 can be viewed as having a low order portion termed the set bits 208 and a high order portion termed the tag bits 112. The set bits 208 are the bits required to address the cache memory 100. The set bits 208 are further divided into an upper group of line bits 204 and a lower group of byte bits 206. The line bits 204 address a line of cache memory 100 and the byte bits 206 address a byte within the data portion 122 of the line. All the main memory 158 locations that would be stored on the same cache line form a set. Because there will be many addresses in main memory 158 that have the same set address, the upper address bits for the data stored in a particular cache line are stored as tag bits 112 in a tag memory 110 to allow checking of the main memory address associated with a given cache line. Each line of data 122 stored in the data memory 120 has a one to one association with a set of tag bits 112 stored in the tag memory 110.

In a set associative cache, searching for a data match is simplified because the cache lines from only one set need be checked. Each cache line is divided into fields that include a tag field 112 indicative of the upper portion of address of the memory block, and a data field 122 that stores the data at the memory location associated with the tag field 112. The tag field 112 is typically stored in a tag memory 110 and the data field 122 is stored in a data memory 120. If a memory access occurs at a predetermined address, then the computer usually first checks the cache tag memory 110 to determine if a "hit," a match between the predetermined address and the address of the data stored in the cache, has occurred. If a hit occurs during execution of a read operation, then the data 122 can be read from the cache line without a time-consuming main memory 158 access. When a write operation is directed to the cache, the data is written to the cache line in the data memory 120 and the upper address is stored in the cache line in the tag memory 110. The data and tags are stored in separate memory arrays to allow the tag to be checked quickly to decide if the cache line contains the addressed memory data. The tag memory 110 is generally smaller and, therefore, faster than the data memory 120.

Errors can occur during the storage of digital values in memory for various reasons including background cosmic radiation and alpha particle bombardment. Such errors invert a data bit, changing it from a binary 1 to a binary 0, or from a binary 0 to binary 1. Invalid output can be fatal. If the data represents a computer instruction, the wrong instruction will be executed. If the data represents an address, the wrong address will be loaded or stored. If the data represents an operand value, the computed value will be incorrect. It is therefore becoming increasingly important to have a means of detecting and correcting errors in the data storage for a computer, including the cache memory 100. To increase the reliability of a computer system, it is desirable to verify the integrity of information stored in the cache, to guard against the small but distinct possibility that the stored data may have been altered in some way.

Parity may be used to detect single bit errors. The "parity" of computer data is defined by the number of set bits in a binary representation of the data. If the data has an even number of set bits, then an "even parity" results. But if the data has an odd number of set bits, then the data has an "odd parity." A "parity bit" is usually appended to the computer data to provide a pre-selected parity. For example, if the parity is predetermined to be "even" for each line of computer data in the cache, then the parity bit gives the data an even parity by either setting or clearing the parity bit according to the number of set bits in the data. Parity checks are useful for both stored data (including instructions) and tags in a cache.

Error detection can be used to detect the existence of errors in stored data and halt operation of programs that are attempting to use erroneous data. However, greater system reliability can be achieved if errors in stored data can be corrected to avoid termination of programs that are using the faulty data. Error correction codes (ECC), often Hamming codes, are commonly employed to provide error correction for memory arrays. In a typical prior art application to a set associative cache, one Hamming code protects a cache line and a second Hamming code protects the related tag address.

An exemplary computer architecture might use a physical memory address 200 of 44 bits and employ a 512 kilobyte (kb) data memory 120. The data field might be 8 bytes (64 bits) long. The bottom 3 address bits would be the byte bits 206 that select a byte within the data field. The middle 16 bits are the line bits 204 which selects a cache line in the tag 110 and data 120 memories. The remaining 25 upper bits are the tag field 112. To provide single error correction, a 25 bit tag requires 5 ECC bits and a 64 bit (8 byte) data field requires 7 ECC bits. Thus, for each cache line in this example, there will be a total of 89 information bits and 12 ECC bits. This represents about 13% additional storage for the ECC bits. However, about 41% of the redundancy is being used to protect the 25 tag bits which represent about 28% of the information.

Figure 3:
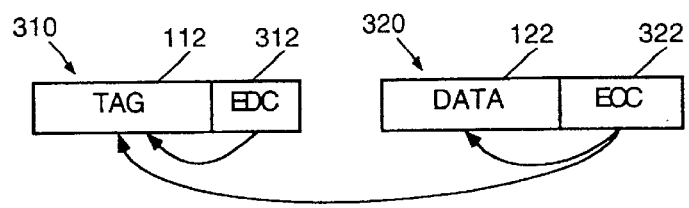
FIG. 3 is an illustration of the application of an error detection code and an error correction code according to an embodiment of the present invention.

While practical cache architectures fetch the tag 112 before fetching the related data 122 to avoid the delays associated with unnecessary cache data fetches, conceptually, the tag 112 and data 122 can be viewed as one code symbol since there is a one to one relationship between the tag 112 and the data 122 on one cache line. In the foregoing example, the tag 112 and the data 122 can be viewed as a 89 bits of information which can be protected against single bit errors by the same 7 bit ECC 322 (FIG. 3) required for the 64 bit cache line data bits alone. Thus, it is possible to reduce the amount of data storage required in exchange for an increase in complexity of error correction and a slight reduction in protection against multi-bit errors.

The present invention reduces the redundancy of ECC bits for applications where data is received in a segmented fashion, such as tag bits 112 followed by data bits 122, by using one set of ECC bits 322 to provide error correction for all the segments combined and only providing a single bit error detection code 312 for segments prior to the last segment. This prevents the unnecessarily high redundancy that results from adding ECC bits to permit correction of each segment independently. The use of error detection on segments prior to the last segment allows those segments to be used immediately if no errors are detected. If error correction is required, then use of erroneous segments is delayed until all segments are received and error correction is performed. In one embodiment shown in FIG. 7, the ECC bits 724 also provide error correction for the error detection bits 714 of the earlier segment 710.

Figure 4:
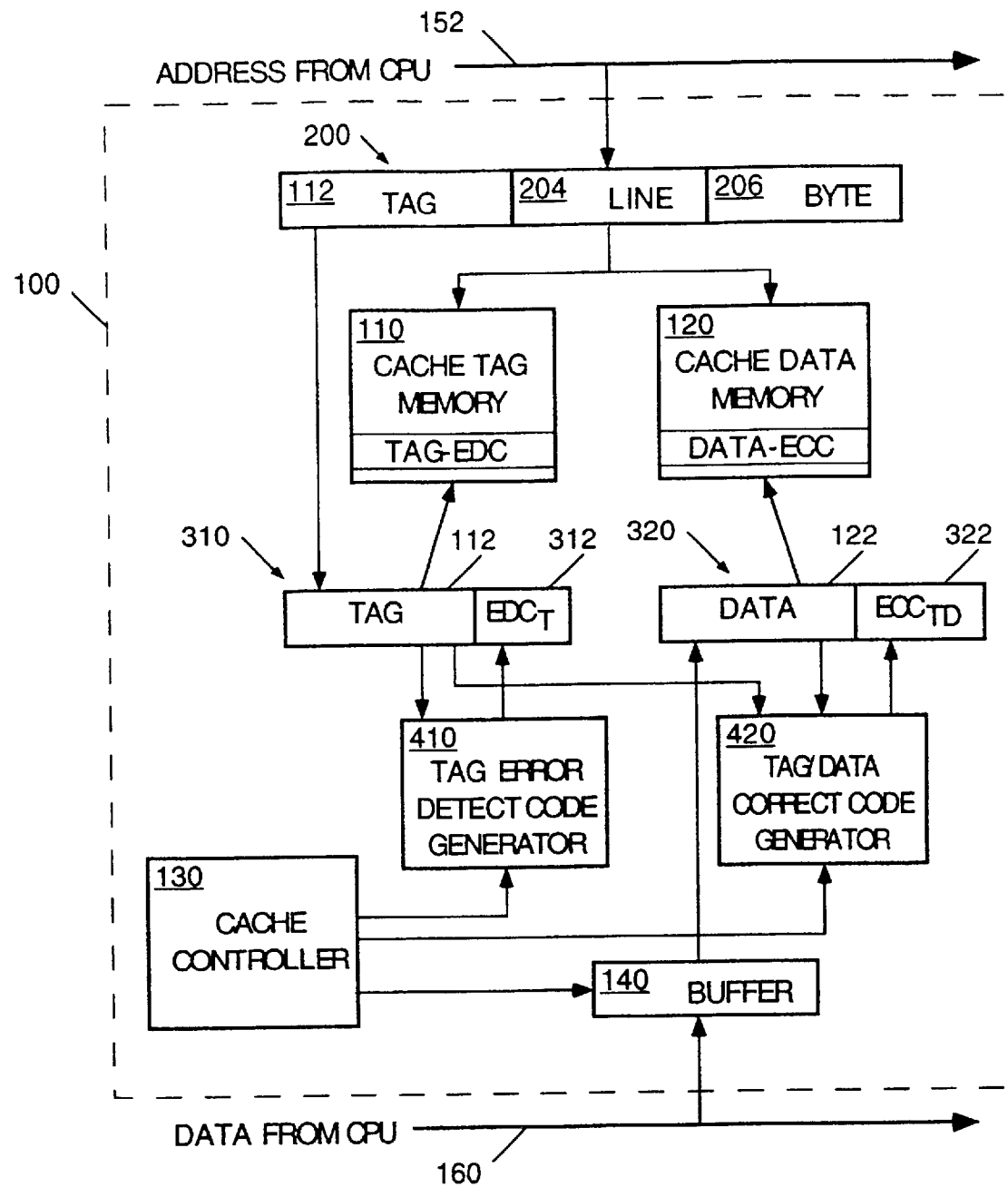
FIG. 4 is a block diagram of a computer system with a set associate cache employing an embodiment of the invention for writing data to memory.

FIG. 4 illustrates a data write operation performed by an embodiment of the present invention. An address 200 is received by the cache memory 100. If it is determined that the write to the address 200 should be applied to the cache memory 100, then the tag field 112 will be written to the tag memory 110 and the data 122 being presented by the CPU 150 through buffer 140 will be written to the data memory 120.

A tag error detection code generator 412 receives the tag bits 112 and generates the appropriate error detection code 312 for the tag bits 112. The tag bits 112 and the error detection code 312 are stored on the cache line in the tag memory 110 as determined by the line bits 204. A tag/data error correction code generator 422 receives the tag bits 112 and the data bits 122 and generates the appropriate error correction code 322 for the tag bits 112 and the data bits 122. The data bits 122 and the error correction code 322 are stored on the cache line in the data memory 120 as determined by the line bits 204.

Figure 5A:
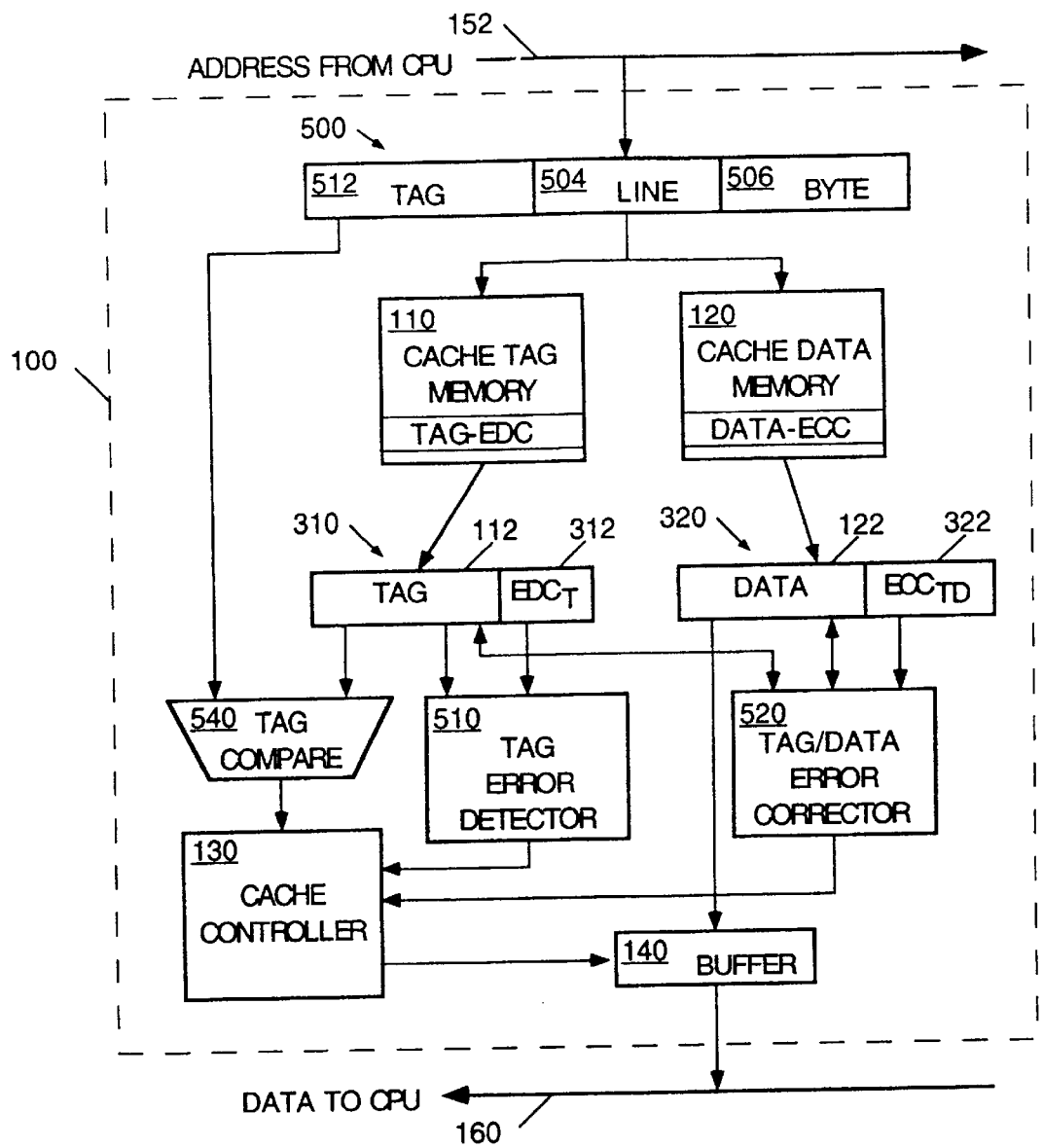
FIG. 5a is a block diagram of a computer system with a set associate cache employing an embodiment of the invention for reading data from memory.

FIG. 5*a* illustrates a data read operation performed by an embodiment of the invention. An incoming address 500 is received by the cache memory 100. The tag address 512 of the incoming address 500 is compared to the tag address 112 stored on the line addressed by the line bits 504 by a tag comparator 540 to determine if the cache memory 100 should fulfill the read request. A tag error detector 510 determines if there are errors in the tag value 310 retrieved from the tag memory 110. If there is a tag match and there are no errors, the data value 320 is fetched from the line addressed by the line bits 504 and returned to the CPU 150 to complete the read operation normally.

If there are errors in the tag value 310, then the read operation must be delayed to allow the cache to attempt error correction. In one embodiment, the CPU is stalled during error correction. In another embodiment, a read fail status is sent to the CPU to abort the current read operation and to force the CPU to retry the read operation; error correction is performed by the cache to allow the read operation to be completed during the retry. If a tag error is detected, then the data value 320 is fetched from the line addressed by the line bits 504. The data value includes ECC 322. A tag/data error corrector 520 use the ECC 322 to correct errors in the tag address 112 and the data bytes 122. The corrected tag address 112 and data bytes 122 are stored in the cache, overwriting the erroneous values.

If the CPU was stalled, the read operation is completed following error correction. The tag comparison is made using the corrected tag address 112. If the tag comparison now indicates that the data is available from the cache memory 100, then the corrected data bytes 122 are provided as the requested data by enabling the buffer 140 for writing to the data bus 160.

The embodiments described above describe the use of the present invention in a 1-way set associative cache to avoid details that would obscure the description of the present invention. It will be appreciated by those skilled in the art that the present invention is equally useful when applied to N-way caches with any number of ways.

Figure 5B:
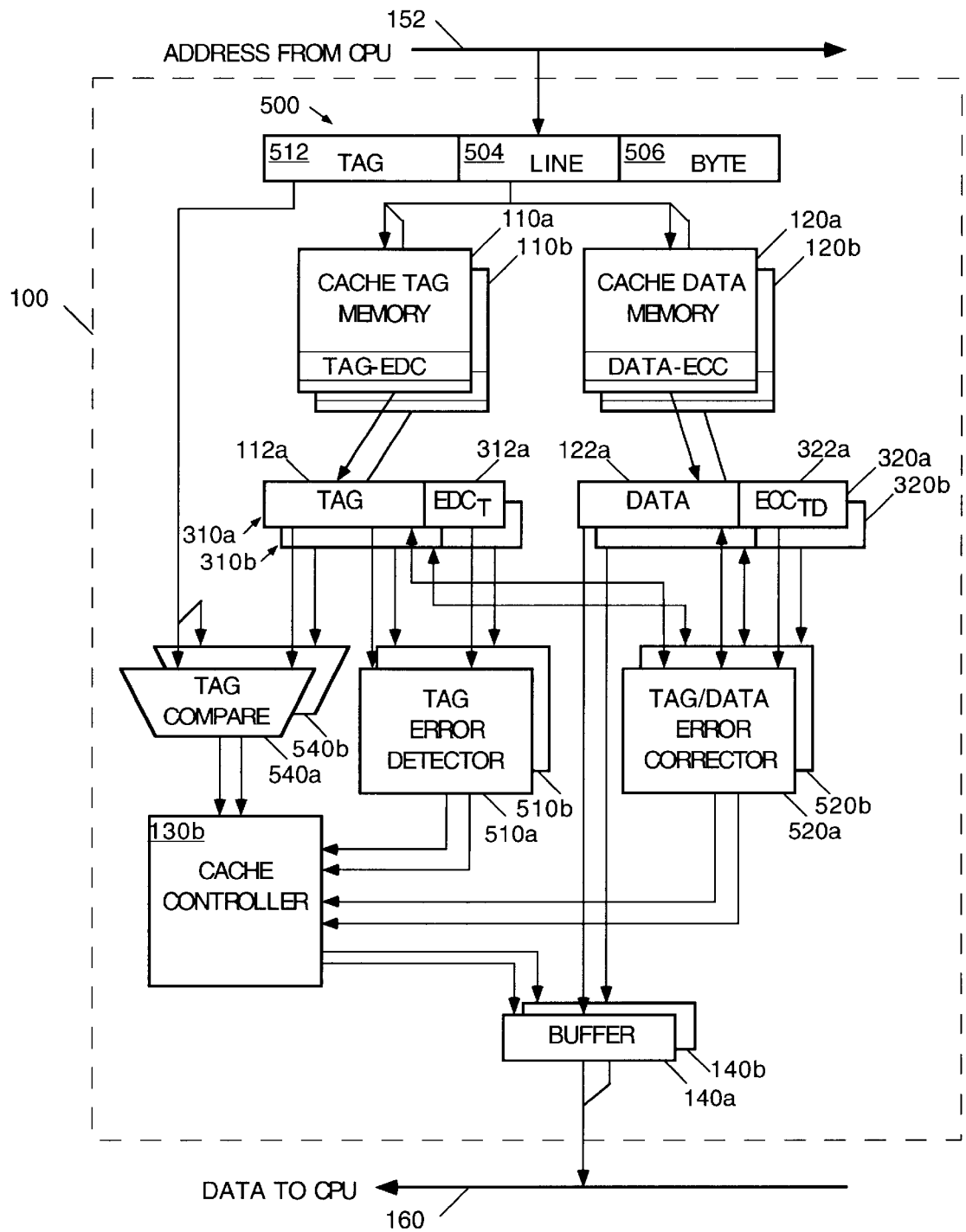
FIG. 5b is a block diagram of a computer system with a 2-way set associate cache employing an embodiment of the invention for reading data from memory.

FIG. 5b illustrates a data read operation performed by an embodiment of the invention as applied to a 2-way set associative cache memory. Each way includes a tag memory 110a, 110b and a data memory 120a, 120b. In this embodiment, there is a tag error detector 510a, 510b for each way. Likewise, there is a tag/data error corrector 520a, 520b for way. The cache controller 130b tests each way for the logical and of the tag compare 540a, 540b with the tag error detector 510a, 510b. If a way is detected with a tag match and no tag error, then a cache hit is recognized. If no cache hit is detected and a tag error is detected in any way, then the CPU is stalled or a retry is forced, and error correction is performed for the tag 112a and the data 122a in the way where an error was detected using the tag/data error corrector 520a associated with that way.

Figure 5C:
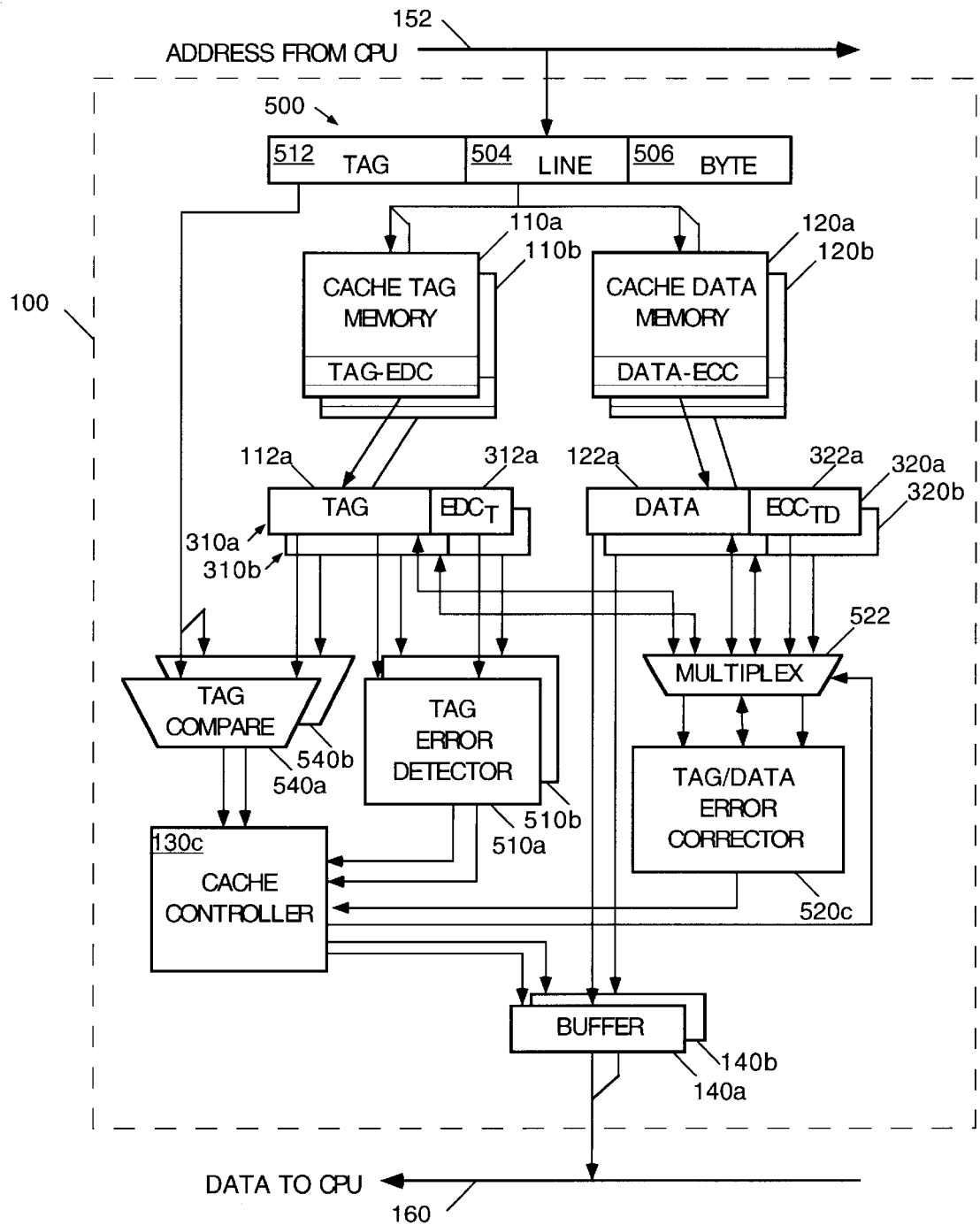
FIG. 5c is a block diagram of a computer system with a 2-way set associate cache employing another embodiment of the invention for reading data from memory.

FIG. 5c illustrates a data read operation performed by another embodiment of the invention as applied to a 2-way set associative cache memory. This embodiment differs from the previous embodiment by using only one tag/data error corrector 520c. In this embodiment, if an error is detected in the tag 112a, a multiplexor 522 selects the tag 112a, data 122a, and $ECC_{TD}$ 322a for the way in which the error was detected. The multiplexor 522 also selects the tag 112a, data 122a, and $ECC_{TD}$ 322a for the way in which a tag match occurred to allow error detection and correction of the data 122a in that way. The multiplexor selection is controlled by the cache controller (control signals not shown).

In the embodiments described above, the error detection code protects the tag value 310 and the error correction code 322 protects the combined tag address 112 and data bytes 122. As may be appreciated by those skilled in the art, the concept of providing a lower level of error protection for earlier delivered information portions coupled with a higher level of error protection for the combination of a set of information portions, to allow immediate use of the earlier information portions while reducing the redundancy of protection information, is susceptible to a variety of embodiments, as illustrated by FIGS. 6 to 10.

Figure 6:
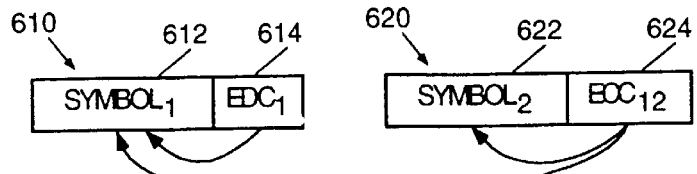
FIG. 6 is an illustration of the application of an error detection code and an error correction code according to an embodiment of the present invention.

FIG. 6 shows the embodiment described above and illustrated by FIGS. 1 to 5, but with a more generalized notation. The first delivered code group 610 includes $Symbol_1$ 612 protected by an error detection code ($EDC_1$) 614. If no error is indicated by $EDC_1$ 614, then $Symbol_1$ 612 is immediately usable. If $EDC_1$ 614 indicates an error, then the second code group 620 is received including $Symbol_2$ 622 and an error correction code ($ECC_{12}$) 624. $ECC_{12}$ 624 provides error detection and correction for a code symbol that includes $Symbol_1$ 612 and $Symbol_2$ 622. After error correction is performed on $Symbol_1$ 612 and $Symbol_2$ 622 using $ECC_{12}$ 624 both symbols are available for use.

Figure 7:
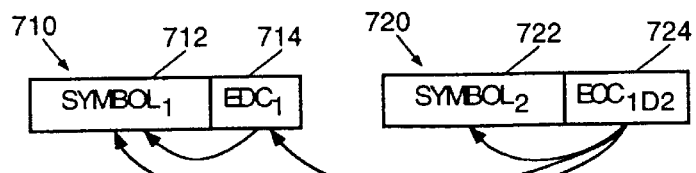
FIG. 7 is an illustration of the application of an error detection code and an error correction code according to another embodiment of the invention.

As previously described, the error correction code can also provide error correction for the EDC in the previously delivered portion. This is shown by FIG. 7. $ECC_{1D2}$ 724 provides an error correcting code for a code symbol that includes $Symbol_1$ 712, $EDC_1$ 714, and $Symbol_2$ 722.

Set associative cache memory requirements can be reduced by making the cache lines longer. For example, in the above described cache there are $2^{16}$ cache line of 8 bytes each to provide $2^{19}$ bytes (512 kb) of cache storage. This requires storage for $2^{16}$ 25 bit tags. If the cache line length is increased to 64 bytes, the number of cache lines is reduced to $2^{13}$. While the size of the cache data storage is the same, 512 kb, the number of tags is reduced by a factor of eight. As noted earlier, the number of data bits that can be protected as a single word has to be balanced against the probability of undetectable errors. With SEC the probability of undetectable errors in 64 bytes is likely to be unacceptably high. The present invention can be applied in such an architecture by dividing the cache line into "data chunks." For example, the 64 byte cache line can be treated as a line of eight 8 byte chunks.

Figure 8:
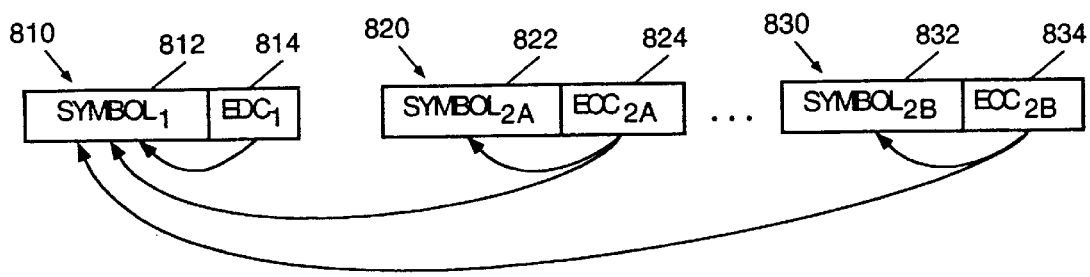
FIG. 8 is an illustration of the application of an error detection code and a plurality of error correction codes according to another embodiment of the invention.

The present invention may be applied to this cache arrangement as shown in FIG. 8. $Symbol_1$ 812 is the tag protected by $EDC_1$ as previously described. Each "chunk" of cache data, represented by $Symbol_{2A}$ 822 to $Symbol_{2B}$ 832, is protected by an error correcting code, represented by $ECC_{2A}$ 824 to $ECC_{2B}$ 834. Each of the chunk ECCs provides error correction for a code symbol that includes the $Symbol_2$ data in the chunk and $Symbol_1$ 812. It will be appreciated that any one of the second symbol ECCs can be used to correct errors in $Symbol_1$ 812. The second symbol is chosen based on the data that corresponds to the requested address. Without the present invention the previously described cache would use 5 ECC bits for the tag and 7 ECC bits for each of the data chunks. By use of the present invention, the 5 ECC bits for the tag can be replaced with one or more parity bits to provide the desired level of single bit error detection without increasing the number of ECC bits required in the data chunks to provide error correction for both the data and the tag bits.

Figure 9:
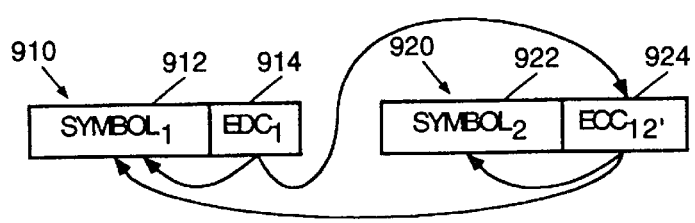
FIG. 9 is an illustration of the application of an error detection code and an error correction code according to another embodiment of the invention.

In another embodiment shown in FIG. 9, the first transmitted $Symbol_1$ 912 is longer than the second transmitted $Symbol_2$ 922. It is possible to use a check bit for $EDC_1$ 914 and make use of the redundancy provided by $EDC_1$ 914 to reduce the number of bits in $ECC_{12}$ 924. For example, if the first data portion is 15 bits and the second data portion is 11 bits, 1 check bit can detect a single bit error for the 15 bits of the first data portion. If no error is detected in $Symbol_1$ 912, a 4 bit $ECC_{12}$ 924 can provide single bit error correction for a code symbol that includes the 11 bits of $Symbol_2$ 922, the 4 bits of $ECC_{12}$ 924, and the 1 bit of $EDC_1$ 914. If an error is detected in $Symbol_1$ 912, the same 4 bit $ECC_{12}$ 924 transmitted with $Symbol_1$ 922 can provide single bit error correction for a code symbol that includes the 15 bits of $Symbol_1$ 912, and the 1 bit of $EDC_1$ 914. Effectively, the ECC includes the 4 bits of $ECC_{12}$ 924, and the 1 bit of $EDC_1$ 914, to form a 5 bit ECC. Table 2 show the maximum number of data bits in the first data portion, $k_1$, and the second data portion, $k_2$, and the number of check bits provided with the second data portion, $r_2$ to provide Hamming code protection. It will be seen that $r_2$ is one less than the number of check bits required for correction of $k_1+k_2$ data bits. Also, $k_1$ is the difference between the maximum number of bits that can be protected by $r_2+1$ bits and by the maximum number of bits that can be protected by $r_2$ bits.

TABLE 2

| $k_1$ data bits | $r_1$ check bit | $k_2$ data bits | $r_2$ check bits |
|---|---|---|---|
| 3 | 1 | 1 | 2 |
| 7 | 1 | 4 | 3 |
| 15 | 1 | 11 | 4 |
| 31 | 1 | 26 | 5 |

Figure 10:
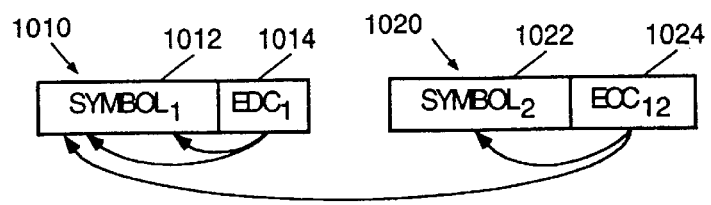
FIG. 10 is an illustration of the application of a plurality of error detection codes and an error correction code according to another embodiment of the invention.

Balancing of the number of data bits protected as a single word against the probability of undetectable errors is also required for the EDC used for the first symbol. In a cache memory with 25 tag bits, a single parity bit may not be sufficient because of the probability of a two bit error in 25 bits. As shown in FIG. 10, a multi-bit error detection code may be employed with the present invention to provide an EDC for the first transmitted $Symbol_1$ 1012. This allows an EDC to be provided with an acceptable risk of undetectable errors. FIG. 10 illustrates the use of multiple parity bits as $EDC_1$ 1014 where each parity bit protects a portion of $Symbol_1$ 1012.

Figure 11:
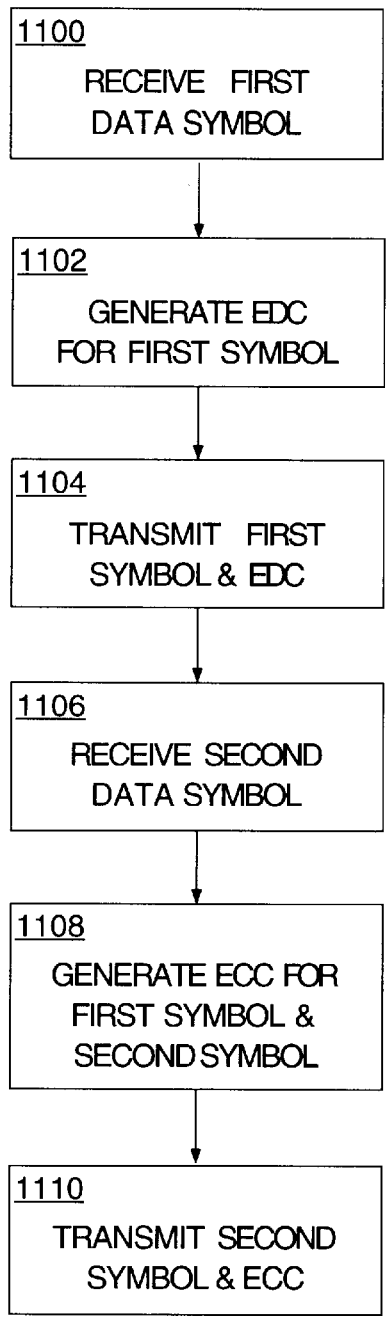
FIG. 11 is a flowchart for a method of transmitting data according to the present invention.

FIG. 11 is a flowchart for a method of transmitting correctable data that embodies the present invention. The data transmitted includes a first symbol and a second symbol where each symbol is transmitted separately. The first symbol is received 1100 and an error detecting code (EDC) is generated for the first symbol 1102. The first symbol and the generated EDC is transmitted 1104. The second symbol is received 1106 and an error correcting code (ECC) is generated for the combination of the first symbol and the second symbol 1108. The second symbol and the generated ECC is transmitted 1110.

Figure 12:
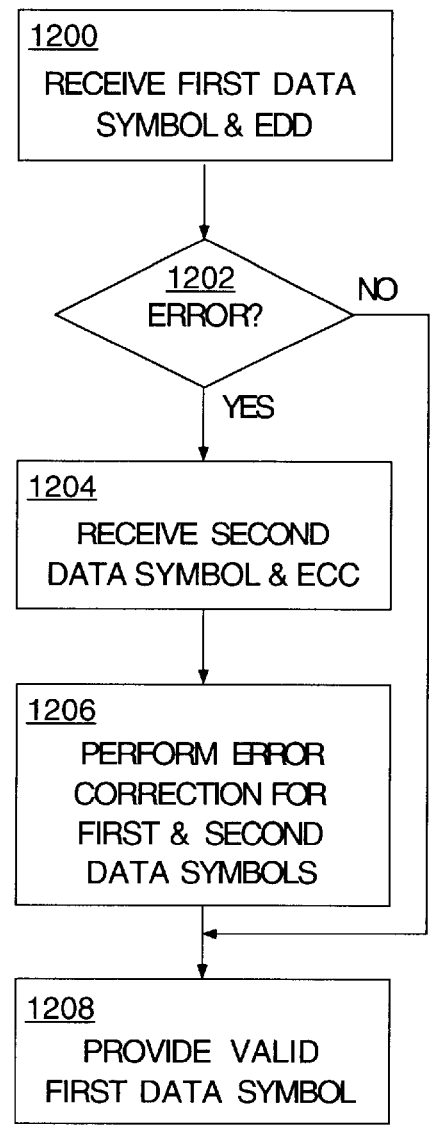
FIG. 12 is a flowchart for a method of transmitting data according to the present invention.

FIG. 12 is a flowchart for a method of receiving and correcting a first data symbol that embodies the present invention. The first data symbol received includes an EDC and a second symbol with an ECC for the combination of the first symbol and the second symbol is received separately. The first data symbol and associated EDC are received 1200. If the EDC does not indicate an error 1202-NO, then the first symbol is provided as valid data 1208. If the EDC does indicate an error 1202-YES, then the second symbol and the ECC for the combination of the first symbol and the second symbol is received 1204. The ECC is used to detect and correct errors in the first and second symbols 1206. The corrected first symbol is then provided as valid data 1208.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art. In particular, the invention is not limited to use in set associative cache memories, nor is it limited to the use of Hamming codes for error correction.

What is claimed is:

1. A computer data signal embedded in one of a machine readable device and a machine readable medium comprising:

a first code group having a first symbol representing tag bits from a cache line of a set associative memory and an error detection code for the first symbol; and a second code group having a second symbol different from the first symbol, the second symbol representing data bits from the cache line of the set associative memory, and an error correction code for a third symbol that includes the first symbol and the second symbol.

2. The computer data signal of claim 1 wherein the third symbol further includes the error detection code.

3. The computer data signal of claim 1 wherein the computer data signal further comprises a plurality of second code groups, each of said plurality of second code groups containing one of a plurality of second number of bits and one of a plurality of sets of error correction bits for the first number of bits and the one of the plurality of second number of bits.

4. The computer data signal of claim 1 wherein the error correction code provides error correction information for the first symbol If the error detection code indicates an error, and error correction information for the second symbol otherwise.

5. The computer data signal of claim 1 wherein the error detection code is a parity bit.

6. The computer data signal of claim 1 wherein the error detection code is a plurality of parity bits, where each of said plurality of parity bits can detect an error in a predetermined portion of the first symbol.

7. A method for transmitting correctable data comprising:

receiving information data having a first symbol representing tag bits from a cache line of a set associative memory and a second symbol different from the first symbol, the second symbol representing data bits from the cache line of the set associative memory;

generating error detection data for the first symbol;

transmitting the first symbol and the error detection data;

generating error correction data for the first symbol and the second symbol; and transmitting the second symbol and the error correction data.

8. The method of claim 7 wherein generating error correction data further comprises generating error correction data for the error detection data.

9. The method of claim 7 wherein the Information data is further comprised of a plurality of second symbols, and the method further comprises generating error correction data for the first symbol and one of the plurality of second symbols, and transmitting said one of the plurality of second symbols and said error correction data.

10. The method of claim 7 wherein the error correction data includes the error detection data.

11. A method for receiving correctable data comprising:

receiving a first transmitted code group having a first information symbol representing tag bits from a cache line of a set associative memory and error detection data for the first transmitted code group;

detecting an error in the first transmitted code group;
if the error is not detected
   providing the first information symbol as a first valid information symbol;
otherwise
   receiving a second transmitted code group having a second information symbol different from the first information symbol, the second symbol representing data bits from the cache line of the set associative memory, and error correction data for the first information symbol and the second transmitted code group,
   performing error correction on the first and second information symbols, and
   providing the first information symbol as the first valid information symbol after performing error correction.

12. The method of claim 11 wherein performing error correction includes performing error correction on the error detection data.

13. The method of claim 11 wherein receiving the second transmitted code group further comprises receiving one of a plurality of second transmitted code groups, each of said plurality of second transmitted code groups comprised of one of a plurality of second information symbols and one of a plurality of error correction data for said first information symbol and said one of a plurality of second transmitted code groups.

14. The method of claim 11 wherein the error correction data Includes the error detection data.

15. A data transmission device comprising:
   a first register that receives a first number of bits representing tag bits from a cache line of a set associative memory;
   a second register that receives a second number of bits different from the first number of bits, the second number of bits representing data bits from the cache line of the set associative memory;
   an error detection generator coupled to the first register that generates an error detection bit for the first number of bits;
   an error correction generator coupled to the first register and the second register that generates a set of error correction bits for the first number of bits and the second number of bits;
   a first data transmitter coupled to the first register and the error detection generator that transmits the first number of bits and the error detection bit; and
   a second data transmitter coupled to the second register and the error correction generator that transmits the second number of bits and the set of error correction bits.

16. The data transmission device of claim 15 wherein the error correction generator generates the set of error correction bits for the first number of bits, the second number of bits, and the error detection bit.

17. The data transmission device of claim 15 further comprising:
   a plurality of second registers that receives one of said plurality of the second number of bits;
   a like plurality of error correction generators, coupled to the first register and one of said plurality of second registers, each of said plurality of error correction generators generating a set of error correction bits for the first number of bits and one of said plurality of the second number of bits; and
   a like plurality of second data transmitters coupled to one of said plurality of second registers and one of said plurality of error correction generators to transmits one of said plurality of second number of bits and said set of error correction bits.

18. The data transmission device of claim 15 wherein the error correction generator is further coupled to the error detection generator and the set of error correction bits includes the error detection bit.

19. An data reception device comprising:
   a first register that receives a first number of bits representing tag bits from a cache line of a set associative memory and an error detection bit for the first number of bits;
   a first data available indicator;
   an error detector coupled to the first register and the first data available indicator, said error detector to detect a first error in the first number of bits and to set the first data available indicator if the first error is not detected;
   a second register that receives a second number of bits different from the first number of bits, the second number of bits representing data bits from the cache line of the set associative memory, and a plurality of error correction bits for the first number of bits and the second number of bits;
   a second data available indicator; and
   an error corrector coupled to the first register, the second register, the first data available indicator, and the second data available indicator, said error corrector to correct a second error In the first number of bits and the second number of bits, and to set the first and second data available indicators.

20. The data reception device of claim 19 wherein said error corrector further corrects the second error in the first number of bits, the second number of bits, and the error detection bit.

21. The data reception device of claim 19 wherein the error corrector further corrects one of the first error in the first number of bits, the second error in the second number of bits, and the second error in the error detection bit.

22. An error detecting and correcting set associative cache memory comprising:
   a tag memory comprising a first number of tag storage locations;
   a tag error detection code generator coupled to the tag memory, for generating an error detection code to detect errors in a tag value, said error detection code being stored with the tag value in the tag memory;
   a data memory comprising a first number of data storage locations; and
   a tag/data error correction code generator coupled to the tag memory and the data memory, for generating an error correction code to correct errors in the tag value and a data value, said error correction code being stored with the data value in the data memory.

23. The cache memory of claim 22, further comprising a tag error detector coupled to the tag memory for detecting an error in a retrieved tag value and preventing use of the retrieved tag value.

24. The cache memory of claim 23, further comprising a tag comparator coupled to the tag memory and the tag error detector, said tag comparator comparing the retrieved tag value and a received tag value, said tag comparator providing a tag match indication if the retrieved tag value equals the received tag value and the tag error detector has not detected an error.

25. The cache memory of claim 22, further comprising a tag error corrector coupled to the tag memory and to the data memory for correcting an error in a retrieved tag value and a retrieved data value.

26. A computer data signal embedded in one of a machine readable device and a machine readable medium comprising:

a first code group having a first symbol representing tag bits from a cache line of a set associative memory and a first code for the first symbol, the first code providing a first level of error protection for the first symbol; and a second code group that is transmitted after the first code group if the first code Indicates an error in the first code group, the second code group having a second symbol different from the first symbol, the second symbol representing data bits from the cache line of the set associative memory, and a second code, the second code providing a second level of error protection for a third symbol that includes the first symbol and the second symbol, the second level of error protection being greater than the first level of error protection.

27. The computer data signal of claim 26 wherein the first code is a single bit error detection code and the second code is an error correction code.

* * * * *